United States Patent
Chien et al.

(10) Patent No.: US 11,848,646 B2
(45) Date of Patent: Dec. 19, 2023

(54) AMPLIFIER CIRCUIT USING VOLTAGE-TO-CURRENT CONVERSION AND ASSOCIATED ENVELOPE TRACKING SUPPLY MODULATOR USING THE SAME

(71) Applicant: MEDIATEK INC., Hsin-Chu (TW)

(72) Inventors: Shih-Hsiung Chien, Hsinchu (TW); Sung-Han Wen, Hsinchu (TW); Kuan-Ta Chen, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 233 days.

(21) Appl. No.: 17/367,616

(22) Filed: Jul. 5, 2021

(65) Prior Publication Data
US 2022/0045647 A1 Feb. 10, 2022

Related U.S. Application Data

(60) Provisional application No. 63/061,209, filed on Aug. 5, 2020.

(51) Int. Cl.
H03F 3/04 (2006.01)
H03F 3/45 (2006.01)
H03F 1/02 (2006.01)

(52) U.S. Cl.
CPC ....... *H03F 1/0222* (2013.01); *H03F 3/45636* (2013.01); *H03F 1/0211* (2013.01); *H03F 1/0244* (2013.01); *H03F 2200/102* (2013.01)

(58) Field of Classification Search
CPC ............... H03F 1/0222; H03F 3/45636; H03F 2200/102; H03F 2200/135; H03F 3/45183;
(Continued)

(56) References Cited

U.S. PATENT DOCUMENTS

| 6,717,474 B2 * | 4/2004 | Chen ................... H03F 3/45206 330/253 |
| 7,279,984 B2 * | 10/2007 | Grillo ................. H03F 3/45183 330/253 |

(Continued)

FOREIGN PATENT DOCUMENTS

| CN | 105379111 A | 3/2016 |
| CN | 106877826 A | 6/2017 |

(Continued)

OTHER PUBLICATIONS

Ho, An 87.1% Efficiency RF-PA Envelope-Tracking Modulator for 80MHz LTE-Advanced Transmitter and 31dBm PA Output Power for HPUE in 0.153μm CMOS, pp. 432-433 and a page including Figure 27.6.7, ISSCC 2018 / SESSION 27 / Power-Converter Techniques / 27.6.

(Continued)

*Primary Examiner* — Khanh V Nguyen
(74) *Attorney, Agent, or Firm* — Winston Hsu

(57) ABSTRACT

An amplifier circuit includes a voltage-to-current conversion circuit and a current-to-voltage conversion circuit. The voltage-to-current conversion circuit generates a current signal according to an input voltage signal, and includes an operational transconductance amplifier (OTA) used to output the current signal at an output port of the OTA. The current-to-voltage conversion circuit generates an output voltage signal according to the current signal, and includes a linear amplifier (LA), wherein an input port of the LA is coupled to the output port of the OTA, and the output voltage signal is derived from an output signal at an output port of the LA.

18 Claims, 4 Drawing Sheets

(58) Field of Classification Search
CPC ........... H03F 3/45475; H03F 2200/144; H03F 2200/165; H03F 2200/21; H03F 2200/451; H03F 2200/48; H03F 2200/498; H03F 2203/45288; H03F 2203/45496; H03F 2203/45512; H03F 2203/45526; H03F 2203/45546; H03F 2203/45558; H03F 2203/45566; H03F 2203/45592; H03F 2203/45596; H03F 2203/45601; H03F 2203/45631; H03F 2203/45632; H03F 2203/45682; H03F 2203/45698; H03F 2203/45712; H03F 2203/45718; H03F 3/193; H03F 3/245; H03F 1/0216; H03F 3/21; H03F 3/45179; H03F 3/45192; H03F 3/45089; H03F 3/04; H03F 1/0244; H03F 1/0211; H03F 2200/504; H03F 1/0227; H03F 3/45; H03G 3/3042; H03G 3/004
USPC .......................................... 330/127, 253, 297
See application file for complete search history.

(56) References Cited

U.S. PATENT DOCUMENTS

| | | | | |
|---|---|---|---|---|
| 7,880,545 | B1* | 2/2011 | Venca | ................. H03F 3/45475 330/253 |
| 9,337,716 | B2* | 5/2016 | Liao | ..................... H02M 1/126 |
| 11,501,750 | B2* | 11/2022 | Yazaki | ................. G10K 11/348 |
| 2013/0321081 | A1 | 12/2013 | Fagg | |
| 2014/0361830 | A1* | 12/2014 | Mathe | ..................... H03F 3/195 330/127 |
| 2015/0162882 | A1 | 6/2015 | Tam | |
| 2017/0212546 | A1 | 7/2017 | Botti | |
| 2019/0214354 | A1 | 7/2019 | Soliman | |

FOREIGN PATENT DOCUMENTS

| | | |
|---|---|---|
| CN | 109756110 B | 5/2020 |
| TW | 201720052 A | 6/2017 |

OTHER PUBLICATIONS

Mahmoudidaryan, A 91%-Efficiency Envelope-Tracking Modulator Using Hysteresis-Controlled Three-Level Switching Regulator and Slew-Rate-Enhanced Linear Amplifier for LTE-80MHz Applications, pp. 428-429 and a page including Figure 27.5.7, ISSCC 2019 / SESSION 27 / Energy Harvesting & DC/DC Control Techniques / 27.5.

Paek, An 88%-Efficiency Supply Modulator Achieving 1.08μs/V Fast Transition and 100MHz Envelope-Tracking Bandwidth for 5G New Radio RF Power Amplifier, pp. 238-239 and a page including Figure 15.1.7, ISSCC 2019 / SESSION 15 / Power for 5G, Wireless Power, and GAN Converters / 15.1.

* cited by examiner

AMPLIFIER CIRCUIT USING VOLTAGE-TO-CURRENT CONVERSION AND ASSOCIATED ENVELOPE TRACKING SUPPLY MODULATOR USING THE SAME

CROSS REFERENCE TO RELATED APPLICATIONS

This application claims the benefit of U.S. provisional application No. 63/061,209, filed on Aug. 5, 2020 and incorporated herein by reference.

BACKGROUND

The present invention relates to an amplifier design, and more particularly, to an amplifier circuit using voltage-to-current conversion to achieve unity feedback factor and input common-mode rejection for a linear amplifier and an associated envelope tracking supply modulator using the amplifier circuit.

A power amplifier (PA) is used to amplify a radio-frequency (RF) signal for radio transmission. The PA is commonly found in a wireless communication device for driving antenna(s) of a transmitter. The power consumption of a PA is critical to a wireless communication device that is battery operated. Traditionally, the PA is biased with a fixed supply voltage. Peak RF output power conditions generally occur when the RF input signal input to the PA is at a maximum level. However, when the PA is backed-off from the peak RF output power conditions, the excess input power must be dissipated by the PA because it is not being transformed into useful RF output power. That is, the traditional fixed PA supply voltage results in significant amount of power loss as heat. Envelope tracking is a technique that requires the supply voltage of the PA to be modulated dynamically with the envelope of the RF input signal. This would make the PA operate closer to the peak level at all times and dramatically improve the efficiency of the PA. That is, the envelope tracking technique modulates the PA supply voltage to track the envelope of the RF input signal for reducing the amount of power dissipated as heat.

In wireless communications, bandwidth is the frequency range occupied by a modulated carrier signal. With the advance of wireless communication technology, a wider bandwidth is used by one modulated carrier signal. For example, the bandwidth requirement increases rapidly in 5G New Radio (NR) applications. Hence, a wide bandwidth linear amplifier is needed by an envelope tracking supply modulator that is used to supply a modulated supply voltage to a PA that has high peak to average power ratio (PAPR) output signals. However, a typical linear amplifier generally consumes large quiescent current for achieving a wide envelope tracking bandwidth. As a result, a typical wide-bandwidth envelope tracking design is power-hungry.

Thus, there is a need for an innovative amplifier design which achieves wide-bandwidth envelope tracking with reduced quiescent current consumption.

SUMMARY

One of the objectives of the claimed invention is to provide an amplifier circuit using voltage-to-current conversion to achieve unity feedback factor and input common-mode rejection for a linear amplifier and an associated envelope tracking supply modulator using the amplifier circuit.

According to a first aspect of the present invention, an exemplary amplifier circuit is disclosed. The exemplary amplifier circuit includes a voltage-to-current conversion circuit and a current-to-voltage conversion circuit. The voltage-to-current conversion circuit is arranged to generate a current signal according to an input voltage signal. The voltage-to-current conversion circuit comprises an operational transconductance amplifier (OTA) arranged to output the current signal at an output port of the OTA. The current-to-voltage conversion circuit is arranged to generate an output voltage signal according to the current signal. The current-to-voltage conversion circuit includes a linear amplifier (LA), wherein an input port of the LA is coupled to the output port of the OTA, and the output voltage signal is derived from an output signal at an output port of the LA.

According to a second aspect of the present invention, an exemplary envelope tracking supply modulator is disclosed. The exemplary envelope tracking supply modulator includes an amplifier circuit arranged to receive an envelope input and generate an amplifier output according to the envelope input, wherein the amplifier output is involved in setting a modulated supply voltage of a power amplifier. The amplifier circuit includes a voltage-to-current conversion circuit and a current-to-voltage conversion circuit. The voltage-to-current conversion circuit is arranged to generate a current signal according to the envelope input. The voltage-to-current conversion circuit includes an operational transconductance amplifier (OTA) arranged to output the current signal at an output port of the OTA. The current-to-voltage conversion circuit is arranged to generate the amplifier output according to the current signal. The current-to-voltage conversion circuit includes a linear amplifier (LA), wherein an input port of the LA is coupled to the output port of the OTA, an output port of the LA is coupled to the PA, and the amplifier output is derived from an output signal at the output port of the LA.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
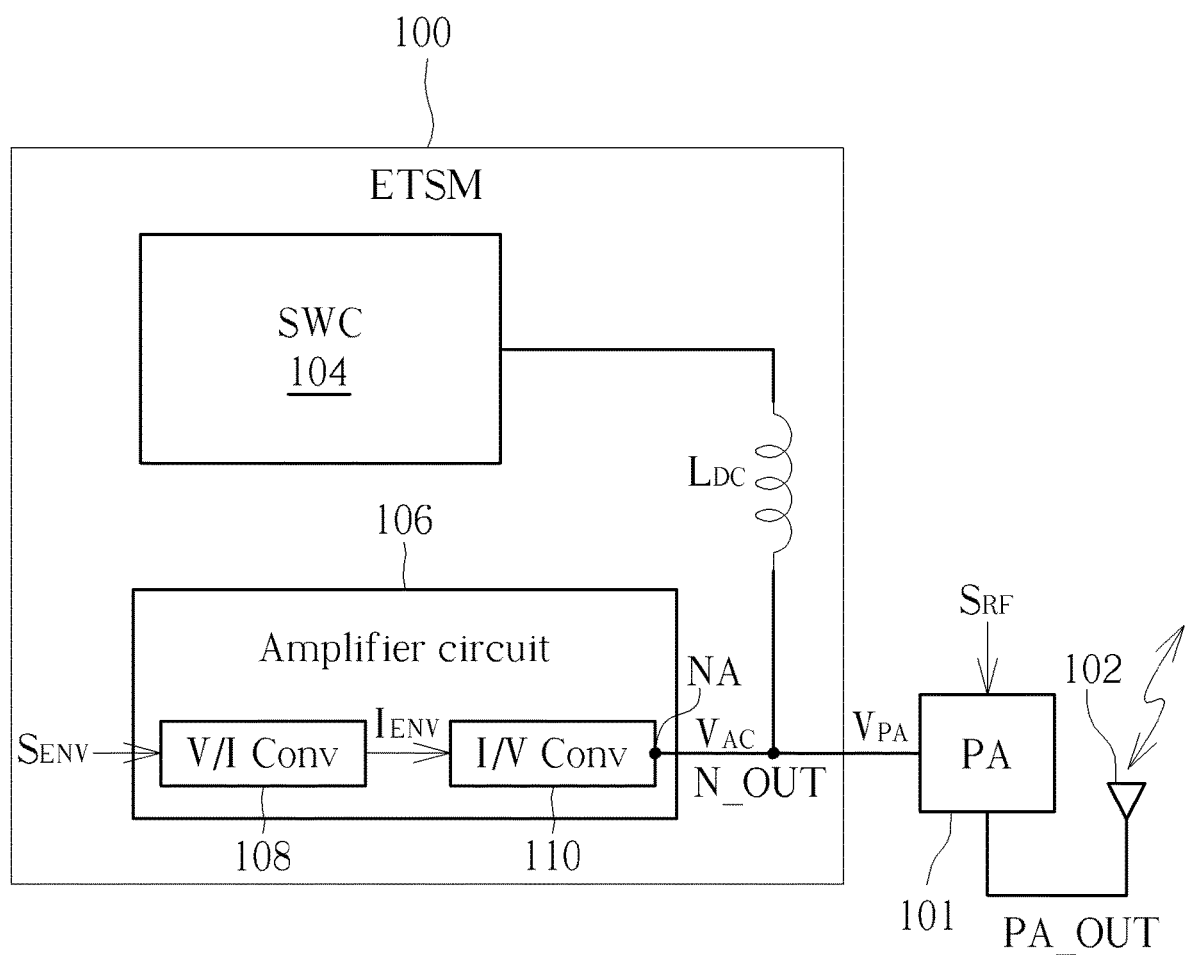
FIG. 1 is a block diagram illustrating an envelope tracking supply modulator according to an embodiment of the present invention.

FIG. 1 is a block diagram illustrating an envelope tracking supply modulator (ETSM) according to an embodiment of the present invention. The ETSM 100 is arranged to generate a modulated supply voltage $V_{PA}$ according to an envelope input $S_{ENV}$, and provide the modulated supply voltage $VP_A$ to a power amplifier (PA) 101. The PA 101 is powered by the modulated supply voltage $V_{PA}$ for amplifying a radio-frequency (RF) signal $S_{RF}$ to generate an RF output PA_OUT with the desired TX power, where the RF output PA_OUT is transmitted to the air via an antenna 102. In this embodiment, the ETSM 100 employs hybrid ETSM architecture, and includes a switching converter (SWC) 104 and an amplifier circuit 106. The SWC 104 is a DC-DC converter arranged to generate a regulated direct current (DC) voltage output $V_{DC}$ to an output port N_OUT of the ETSM 100 via an inductor $L_{DC}$. For example, the SWC 104 may be implemented by a buck converter. The amplifier circuit 106 is arranged to receive the envelope input $S_{ENV}$, and generate an amplifier output (which is an output voltage signal) $V_{AC}$ according to the envelope input $S_{ENV}$. The envelope input $S_{ENV}$ is derived from processing a transmit (TX) baseband signal generated from a modulator/demodulator (Modem) in a wireless transceiver. For example, the TX baseband signal (digital signal) is fed into an envelope tracking digital baseband circuit (which may include an envelope detection block, a power scaling block, a lookup table, an upsampling block, etc.), a processing result of the TX baseband signal is output from the envelope tracking digital baseband circuit and converted into an analog signal (voltage signal) by a digital-to-analog converter, and then the analog signal (voltage signal) is processed by an analog filter to act as the envelope input (voltage signal) $S_{ENV}$. However, this is for illustrative purposes only, and is not meant to be a limitation of the present invention. Since the present invention focuses on the amplifier design, further description directed to generation of the envelope input $S_{ENV}$ is omitted for brevity.

The amplifier circuit 106 transmits the amplifier output $V_{AC}$ to the output port N_OUT of the ETSM 100. In accordance with the hybrid ETSM architecture, the regulated DC voltage $V_{DC}$ and the amplifier output $V_{AC}$ jointly control the modulated supply voltage $V_{PA}$ of the PA 101. More specifically, the regulated voltage $V_{DC}$ decides a DC part (i.e., low-frequency part) of the modulated supply voltage $V_{PA}$, and the amplifier output $V_{AC}$ decides an AC part (i.e., high-frequency part) of the modulated supply voltage $V_{PA}$.

In this embodiment, the amplifier circuit 106 employs the proposed wideband amplifier architecture, and thus uses voltage-to-current conversion to achieve unity feedback factor and input common-mode rejection for a linear amplifier. As shown in FIG. 1, the amplifier circuit 106 includes a voltage-to-current conversion circuit (labeled as "V/I Conv") 108 and a current-to-voltage conversion circuit (labeled as "I/V Conv") 110. The voltage-to-current conversion circuit 108 is arranged to generate a current signal $I_{ENV}$ according to an input voltage signal (e.g., envelope input $S_{ENV}$). The current-to-voltage conversion circuit 110 is arranged to generate an output voltage signal (e.g., amplifier output $V_{AC}$) according to the current signal $I_{ENV}$. The output voltage signal (e.g., amplifier output $V_{AC}$) is generated at an output port NA of the current-to-voltage conversion circuit 110, and the output port NA of the current-to-voltage conversion circuit 110 is coupled to the SWC 104 via the inductor $L_{DC}$. It should be noted that the current-to-voltage conversion circuit 110 does not need an input resistor for converting the current signal $I_{ENV}$ into an input voltage of a linear amplifier. Further details of the proposed wideband amplifier architecture are described as below.

Figure 2:
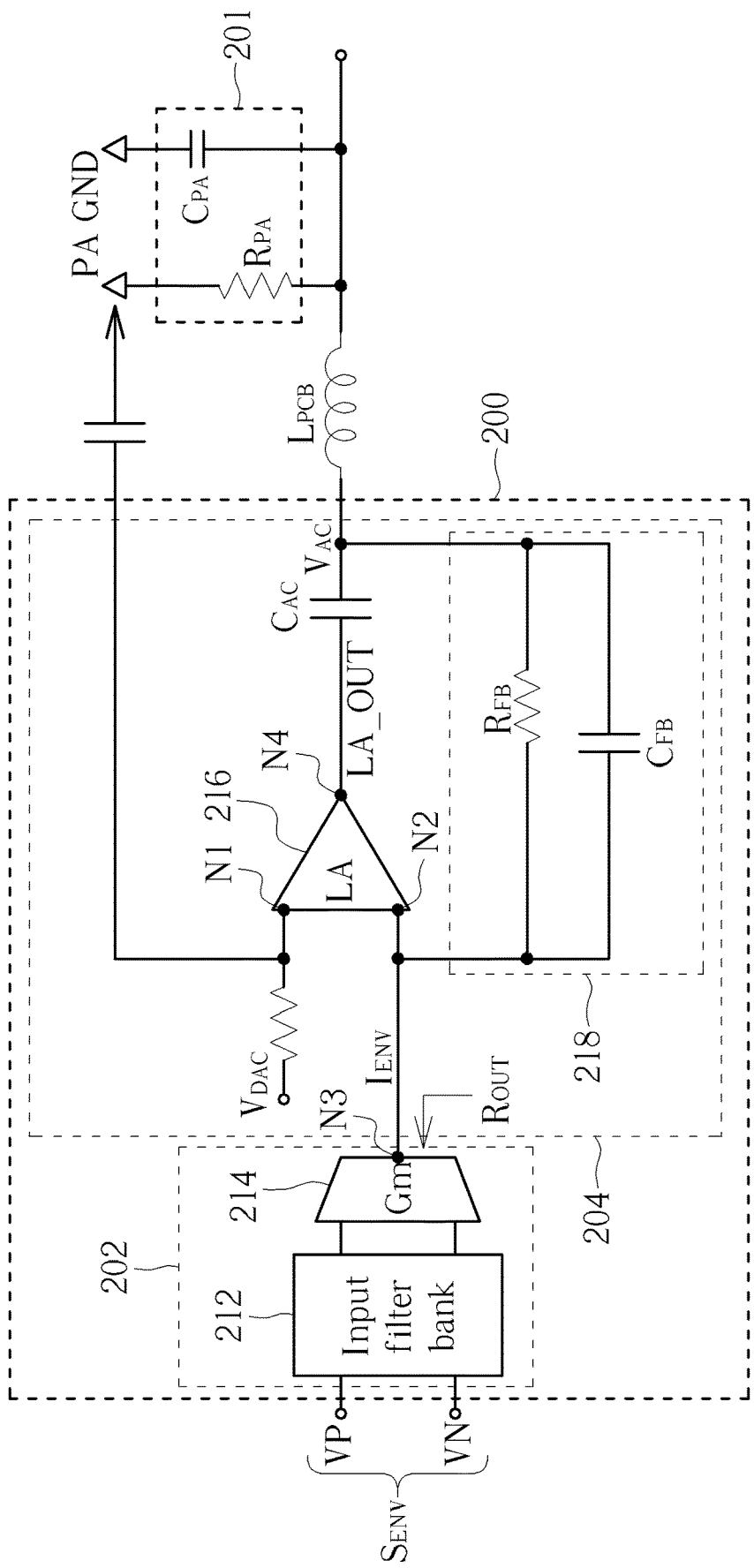
FIG. 2 is a diagram illustrating an amplifier circuit according to an embodiment of the present invention.

FIG. 2 is a diagram illustrating an amplifier circuit according to an embodiment of the present invention. The amplifier circuit 106 shown in FIG. 1 may be implemented by the amplifier circuit 200 shown in FIG. 2, and the PA 101 shown in FIG. 1 may act as a load 201 of the amplifier circuit 200, where the load 201 may be modeled by a resister $R_{PA}$ and a capacitor $C_{PA}$ connected in parallel, and is coupled to the amplifier circuit 200 via a printed circuit board (PCB) trace inductor $L_{PCB}$. The amplifier circuit 200 includes a voltage-to-current conversion circuit 202 and a current-to-voltage conversion circuit 204. The voltage-to-current conversion circuit 202 includes an input filter bank 212 and an operational transconductance amplifier (OTA) 214 with transconductance $G_m$. In this embodiment, the envelope input $S_{ENV}$ acts as an input voltage signal of the amplifier circuit 200, and is a differential signal consisting of a positive signal VP and a negative signal VN. The input filter bank 212 applies noise filtering to the envelope input $S_{ENV}$ before the envelope input $S_{ENV}$ is processed by the OTA 214. The OTA 214 generates a current signal $T_{ENV}$ at an output port N3 by applying voltage-to-current conversion to the envelope input $S_{ENV}$ passing through the input filter bank 212, where $I_{ENV}=G_m*S_{ENV}$.

The current-to-voltage conversion circuit 204 includes a linear amplifier (LA) 216, a feedback network 218, and an optional AC coupling capacitor $C_{AC}$. An input port of the LA 216 may include a first input node N1 and a second input node N2, where a voltage signal $V_{DAC}$ provided by a digital-to-analog converter (DAC) is coupled to the first input node N1, and the current signal $I_{ENV}$ generated from the voltage-to-current conversion circuit 202 (particularly, OTA 214) is coupled to the second input node N2. Specifically, the input port of the LA 216 (particularly, second input node N2 of the LA 216) is directly connected to the output port N2 of the OTA 214, such that there is no input resistor for the LA 216. The feedback network 218 is coupled between the input port of the LA 216 (particularly, second input node N2 of the LA 216) and an output port N4 of the LA 216, and includes at least one resistor $R_{FB}$ and at least one optional capacitor $C_{FB}$. The resistor $R_{FB}$ is a feedback resistor used to return part of the output signal (output voltage) LA_OUT from the output port N4 of the LA 216 to the second input node N2 of the LA 216. In this embodiment, the resistor $R_{FB}$ of the feedback network 218 further deals with current-to-voltage conversion of the current signal $I_{ENV}$. In a case where the capacitor $C_{FB}$ is implemented in the feedback network 218, the capacitor $C_{FB}$ can be used for noise filtering. However, this is not meant to be a limitation of the present invention. Alternatively, the capacitor $C_{FB}$ may be omitted from the feedback network 218.

As shown in FIG. 2, the LA 216 generates the output signal LA_OUT at the output port N4, where an amplifier output $V_{AC}$ of the amplifier circuit 200 is derived from the output signal (output voltage) LA_OUT. In a case where the AC coupling capacitor $C_{AC}$ is implemented in the current-to-voltage conversion circuit 204, the amplifier output $V_{AC}$ is obtained by passing the output signal LA_OUT through the AC coupling capacitor $C_{AC}$. The AC coupling capacitor $C_{AC}$ is capable of applying DC smoothing to the output signal LA_OUT, thereby allowing the LA 216 to operate under a lower voltage range for additional quiescent current reduction. However, this is not meant to be a limitation of the present invention. In some embodiments of the present invention, the AC coupling capacitor $C_{AC}$ may be omitted from the current-to-voltage conversion circuit 204, and the output signal LA_OUT may directly act as the amplifier output $V_{AC}$.

Due to inherent characteristics of the OTA 214, the output impedance $R_{OUT}$ of the OTA 214 (i.e., the impedance (or resistance) looking into the OTA 214 from the current-to-voltage conversion circuit 204) is large. Hence, a feedback factor β of the feedback network 218 may be regarded as having a value equal to 1. That is, the feedback network 218 may have a unity feedback factor (β=1) due to large output impedance $R_{OUT}$ possessed by the OTA 214. The feedback factor β of the feedback network 218 may be expressed by the following formula.

$$\beta = \frac{R_{OUT}}{R_{FB} + R_{OUT}} = 1, \text{ where } R_{OUT} \gg R_{FB} \quad (1)$$

Compared to a conventional LA design with a feedback factor β smaller than one, an operational amplifier needs to consume larger quiescent current to have a larger open-loop gain for meeting a target closed-loop gain requirement. To address this issue, the present invention proposes using the voltage-to-current conversion circuit 202 with large output impedance $R_{OUT}$ to make the feedback factor β equal to one, thus allowing the LA 216 to meet the same target closed-loop gain requirement under lower quiescent current consumption. In other words, the present invention proposes an amplifier circuit using an LA with unity-gain feedback for better power efficiency.

As mentioned above, the amplifier output $V_{AC}$ decides an AC part (i.e., high-frequency part) of the modulated supply voltage $V_{PA}$. Hence, a conventional LA design may suffer from input common-mode (CM) swing due to envelope tracking swing at the modulated supply voltage $V_{PA}$ that is fed back to the voltage input of the LA. To address this issue, the present invention proposes using the voltage-to-current conversion circuit 202 to provide the LA 216 with a current-mode input rather than a voltage-mode input, where the current signal $I_{ENV}$ is immune to the envelope tracking swing at the modulated supply voltage $V_{PA}$. To put it simply, the voltage-to-current conversion circuit 202 offers input CM rejection in the current mode, and therefore ensures less CM voltage swing for the LA 216. Since the LA 216 has a fixed CM voltage level at its inputs, the LA 216 can have improved linearity as well as lower quiescent current consumption.

The closed loop gain G of the amplifier circuit 200 can be expressed using the following formula.

$$G = \frac{V_{OUT}}{V_{IN}} = \frac{LA\_OUT}{S_{ENV}} = G_m \cdot R_{FB} \quad (2)$$

Figure 3:
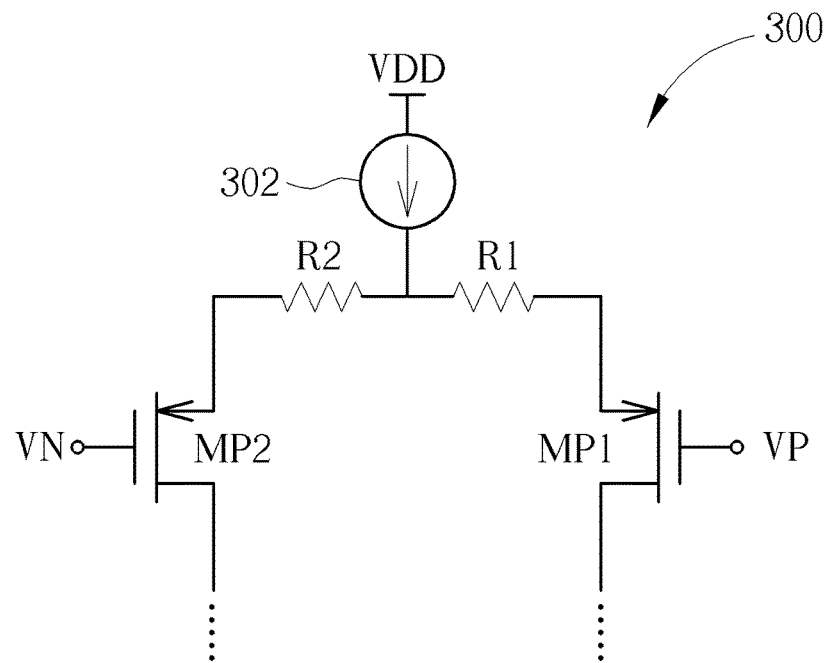
FIG. 3 is a diagram illustrating a source degenerated amplifier according to an embodiment of the present invention.

Since the resistance of the feedback resistor $R_{FD}$ is fixed, variation of the transconductance $G_m$ provided by the OTA 214 affects the stability of the closed loop gain G. To achieve stable transconductance $G_m$, the present invention proposes using a source degenerated amplifier. FIG. 3 is a diagram illustrating a source degenerated amplifier according to an embodiment of the present invention. The OTA 214 shown in FIG. 2 may be implemented by the source degenerated amplifier 300 shown in FIG. 3. For brevity and simplicity, FIG. 3 only shows a part of the source degenerated amplifier 300. The source degenerated amplifier 300 includes a differential pair with source degeneration, where the differential pair consists of two P-channel metal-oxide-semiconductor (PMOS) transistors MP1 and MP2, a source terminal of the PMOS transistor MP1 is series-connected to one end of a resistor R1 (R1=$R_{deg}$), a source terminal of the PMOS transistor MP2 is series-connected to one end of a resistor R2 (R2=$R_{deg}$) and the other end of the resistor R1 and the other end of the resistor R2 are both coupled to a supply voltage VDD via a current source 302. The transconductance $G_m$ of the source degenerated amplifier 300 may be expressed using the following formula.

$$G_m = \frac{g_m}{1 + g_m \cdot R_{deg}} \quad (3)$$

In above formula (3), $g_m$ represents the transconductance of each PMOS transistor MP1/MP2. If one or both of g, and $R_{deg}$ are properly set to make $g_m \cdot R_{deg} \gg 1$, the transconductance $G_m$ of the source degenerated amplifier 300 may be expressed using the following formula.

$$G_m = \frac{g_m}{1 + g_m \cdot R_{deg}} = \frac{g_m}{g_m \cdot R_{deg}} = \frac{1}{R_{deg}}, \text{ where } g_m \cdot R_{deg} \gg 1 \quad (4)$$

Thus, under a condition where $g_m R_{deg} \gg 1$, the closed loop gain G of the amplifier circuit 200 can be expressed using the following formula $$G = G_m \cdot R_{FB} = \frac{R_{FB}}{R_{deg}} \quad (5)$$

Since the closed loop gain G is determined by a ratio of resistance of the feedback resistor to resistance of the source degeneration, the closed loop gain G is a fixed value, regardless of operations of the amplifier circuit 200.

Figure 4:
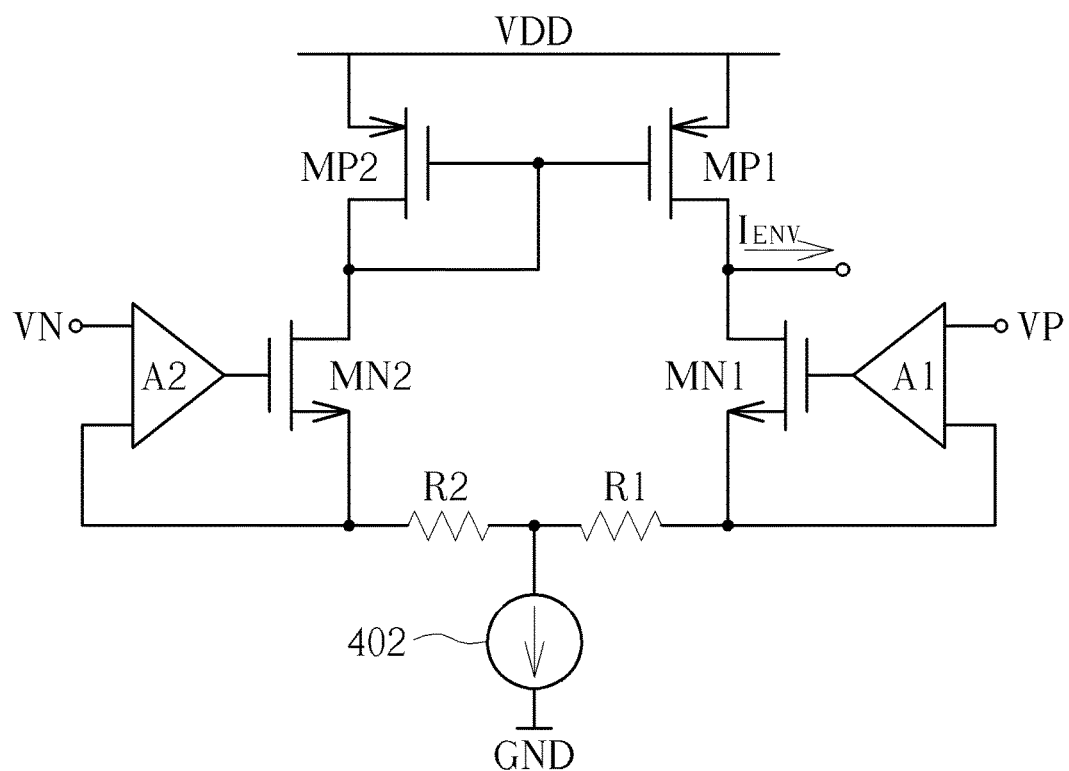
FIG. 4 is a diagram illustrating a source degenerated amplifier with transconductance boosting according to an embodiment of the present invention.

In some embodiments of the present invention, a transconductance boosting technique may be employed to ensure that the condition of $g_m \cdot R_{deg} \gg 1$ is met. FIG. 4 is a diagram illustrating a source degenerated amplifier with transconductance boosting according to an embodiment of the present invention. The OTA 214 shown in FIG. 2 may be implemented by the source degenerated amplifier 400 shown in FIG. 4. The source degenerated amplifier 400 includes PMOS transistors MP1, MP2, NMOS transistors MN1, MN2, amplifiers A1, A2, resistors R1, R2, and a current source 402. The source degenerated amplifier 400 has a differential pair with source degeneration that consists of two NMOS transistors MN1 and MN2, where a source terminal of the NMOS transistor MN1 is series-connected to one end of the resistor R1 (R1=$R_{deg}$), a source terminal of the NMOS transistor MN2 is series-connected to one end of the resistor R2 (R2=$R_{deg}$), and the other end of the resistor R1 and the other end of the resistor R2 are both coupled to a ground voltage GND via the current source 402. The amplifiers A1 and A2 are used to boost the transconductance of the differentialpair. Specifically, the amplifier A1 is used to boost the transconductance $g_m$ of the NMOS transistor MN1, and the amplifier A2 is used to boost the transconductance $g_m$ of the NMOS transistor MN2.

With the advance of wireless communication technology, a wider bandwidth is used by one modulated carrier signal. For example, the bandwidth requirement increases rapidly in 5G New Radio (NR) applications. Hence, a wide bandwidth linear amplifier is needed by an envelope tracking supply modulator that is used to supply a modulated supply voltage to a power amplifier. When the amplifier circuit 200 using a source degeneration amplifier with transconductance boosting is employed by a wideband application, the present invention further proposes using a two-stage amplifier with at least one compensation capacitor as a transconductance boosting amplifier (e.g., amplifier A1 or A2 shown in FIG. 4), so as to ensure that the condition of $g_m \cdot R_{deg} \gg 1$ is still met under higher frequencies.

Figure 5:
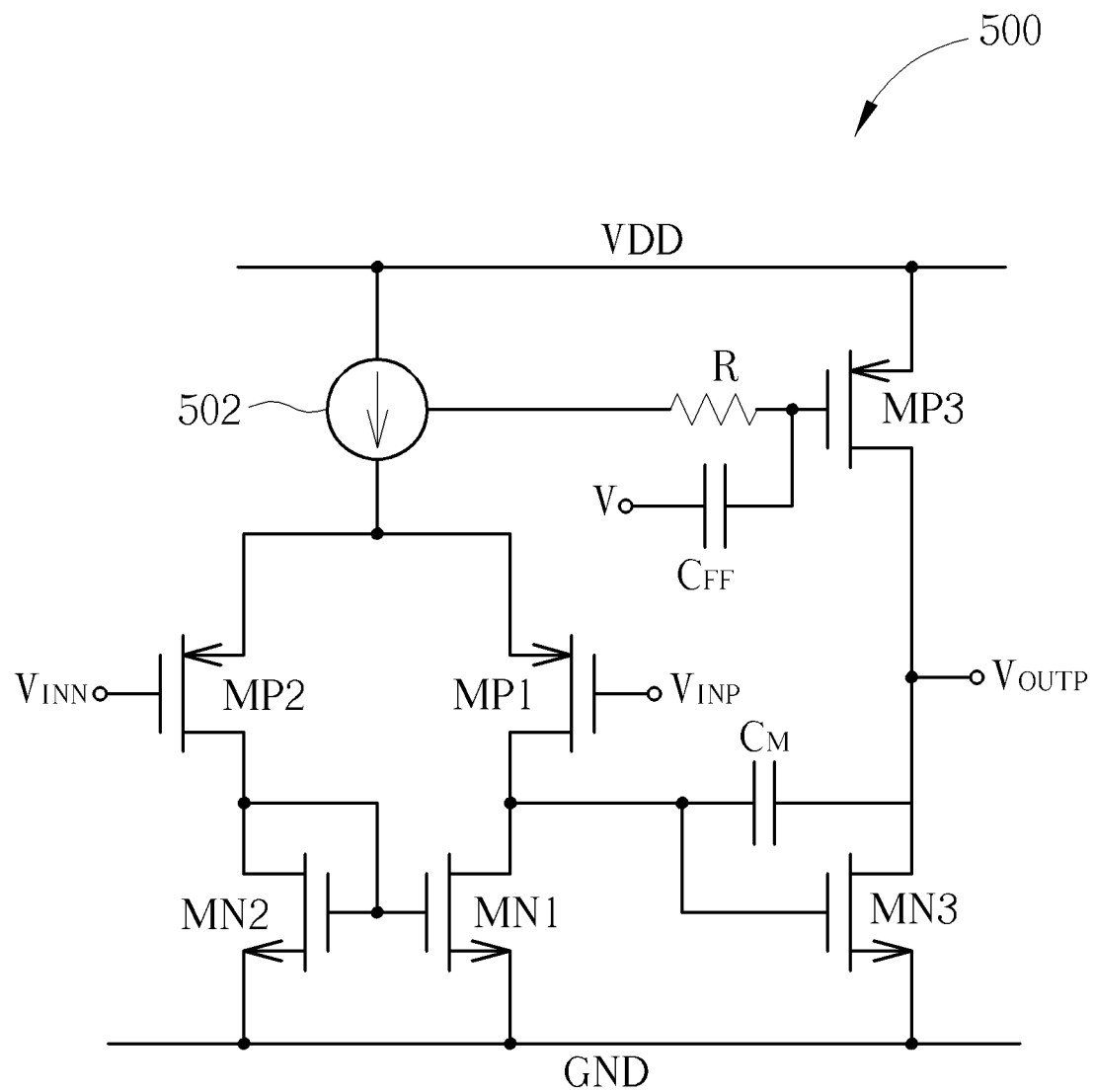
FIG. 5 is a diagram illustrating a two-stage amplifier with at least one compensation capacitor according to an embodiment of the present invention.

FIG. 5 is a diagram illustrating a two-stage amplifier with at least one compensation capacitor according to an embodiment of the present invention. Each of the amplifiers A1 and A2 shown in FIG. 4 may be implemented by the two-stage amplifier 500 shown in FIG. 5. The two-stage amplifier 500 receives input voltages $V_{INN}$ and $V_{INP}$, and generates an output voltage $V_{OUTP}$ to a transconductance boosting target (e.g., NMOS transistor MN1 or MN2 shown in FIG. 4). As shown in FIG. 5, the two-stage amplifier 500 includes PMOS transistors MP1, MP2, MP3, NMOS transistors MN1, MN2, MN3, a resistor R, a current source 502, a Miller compensation capacitor $C_M$, and a feed forward compensation capacitor $C_{FF}$. The use of Miller compensation capacitor $C_M$ and/or feed forward compensation capacitor $C_{FF}$ can ensure that the transconductance $g_m$ of the NMOS transistor MN1/MN2 is still boosted under higher frequencies. In this embodiment, the Miller compensation capacitor $C_M$ and the feed forward compensation capacitor $C_{FF}$ are both implemented in the two-stage amplifier 500. However, this is for illustrative purposes only, and is not meant to be a limitation of the present invention. In one alternative design, the two-stage amplifier 500 may be modified to omit the feed forward compensation capacitor $C_{FF}$. In another alternative design, the two-stage amplifier 500 may be modified to omit the Miller compensation capacitor $C_M$.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An amplifier circuit comprising:
   a voltage-to-current conversion circuit, arranged to generate a current signal according to an input voltage signal, wherein the voltage-to-current conversion circuit comprises:
      an operational transconductance amplifier (OTA), arranged to output the current signal at an output port of the OTA; and
   a current-to-voltage conversion circuit, arranged to generate an output voltage signal according to the current signal, wherein the current-to-voltage conversion circuit comprises:
      a linear amplifier (LA), wherein an input port of the LA is coupled to the output port of the OTA, and the output voltage signal is derived from an output signal at an output port of the LA;
   wherein the OTA is a source degenerated amplifier, and the source degenerated amplifier comprises a differential pair with source degeneration, and further comprises amplifiers arranged to boost transconductance of the differential pair.

2. The amplifier circuit of claim 1, wherein no input resistor is connected between the input port of the LA and the output port of the OTA.

3. The amplifier circuit of claim 1, wherein each of the amplifiers is a two-stage amplifier with at least one compensation capacitor.

4. The amplifier circuit of claim 1, wherein the current-to-voltage conversion circuit further comprises:
   a feedback resistor, coupled between the input port and the output port of the LA;
   wherein a ratio of the output voltage signal to the input voltage signal is determined by a ratio of resistance of the feedback resistor to resistance of the source degeneration.

5. The amplifier circuit of claim 1, wherein the current-to-voltage conversion circuit further comprises:
   a feedback network, comprising:
      at least one resistor, coupled between the input port and the output port of the LA.

6. The amplifier circuit of claim 5, wherein the feedback network further comprises:
   at least one capacitor, coupled between the input port and the output port of the LA, for noise filtering.

7. The amplifier circuit of claim 5, wherein the feedback network has a unity feedback factor.

8. The amplifier circuit of claim 1, wherein the current-to-voltage conversion circuit further comprises:
   an alternating current (AC) coupling capacitor, coupled to the output port of the LA, and arranged to generate and output the output voltage signal according to the output signal of the LA.

9. An amplifier circuit comprising:
   a voltage-to-current conversion circuit, arranged to generate a current signal according to an input voltage signal, wherein the voltage-to-current conversion circuit comprises:
      an operational transconductance amplifier (OTA), arranged to output the current signal at an output port of the OTA; and
   a current-to-voltage conversion circuit, arranged to generate an output voltage signal according to the current signal, wherein the current-to-voltage conversion circuit comprises:
      a linear amplifier (LA), wherein an input port of the LA is coupled to the output port of the OTA, and the output voltage signal is derived from an output signal at an output port of the LA;
   wherein the output voltage signal is generated at an output port of the current-to-voltage conversion circuit, and the output port of the current-to-voltage conversion circuit is coupled to a switching converter via an inductor.

10. An envelope tracking supply modulator comprising:
   an amplifier circuit, arranged to receive an envelope input, and generate an amplifier output according to the envelope input, wherein the amplifier output is involved in setting a modulated supply voltage of a power amplifier, and the amplifier circuit comprises:
      a voltage-to-current conversion circuit, arranged to generate a current signal according to the envelope input, wherein the voltage-to-current conversion circuit comprises:

an operational transconductance amplifier (OTA), arranged to output the current signal at an output port of the OTA; and a current-to-voltage conversion circuit, arranged to generate the amplifier output according to the current signal, wherein the current-to-voltage conversion circuit comprises:

a linear amplifier (LA), wherein an input port of the LA is coupled to the output port of the OTA, an output port of the LA is coupled to the PA, and the amplifier output is derived from an output signal at the output port of the LA;

wherein the OTA is a source degenerated amplifier, and the source degenerated amplifier comprises a differential pair with source degeneration, and further comprises amplifiers arranged to boost transconductance of the differential pair.

11. The envelope tracking supply modulator of claim 10, wherein no input resistor is connected between the input port of the LA and the output port of the OTA.

12. The envelope tracking supply modulator of claim 10, wherein each of the amplifiers is a two-stage amplifier with at least one compensation capacitor.

13. The envelope tracking supply modulator of claim 10, wherein the current-to-voltage conversion circuit further comprises:

a feedback resistor, coupled between the input port and the output port of the LA;

wherein a ratio of the amplifier output to the envelope input is determined by a ratio of resistance of the feedback resistor to resistance of the source degeneration.

14. The envelope tracking supply modulator of claim 10, wherein the current-to-voltage conversion circuit further comprises:

a feedback network, comprising:
at least one resistor, coupled between the input port and the output port of the LA.

15. The envelope tracking supply modulator of claim 14, wherein the feedback network further comprises:

at least one capacitor, coupled between the input port and the output port of the LA, for noise filtering.

16. The envelope tracking supply modulator of claim 14, wherein the feedback network has a unity feedback factor.

17. The envelope tracking supply modulator of claim 10, wherein the current-to-voltage conversion circuit further comprises:

an alternating current (AC) coupling capacitor, coupled between the PA and the output port of the LA, and arranged to generate and output the amplifier output according to the output signal of the LA.

18. An envelope tracking supply modulator comprising:

an amplifier circuit, arranged to receive an envelope input, and generate an amplifier output according to the envelope input, wherein the amplifier output is involved in setting a modulated supply voltage of a power amplifier, and the amplifier circuit comprises:

a voltage-to-current conversion circuit, arranged to generate a current signal according to the envelope input, wherein the voltage-to-current conversion circuit comprises:

an operational transconductance amplifier (OTA), arranged to output the current signal at an output port of the OTA; and a current-to-voltage conversion circuit, arranged to generate the amplifier output according to the current signal, wherein the current-to-voltage conversion circuit comprises:

a linear amplifier (LA), wherein an input port of the LA is coupled to the output port of the OTA, an output port of the LA is coupled to the PA, and the amplifier output is derived from an output signal at the output port of the LA; and a switching converter;

wherein the amplifier output is generated at an output port of the current-to-voltage conversion circuit, and the output port of the current-to-voltage conversion circuit is coupled to the switching converter via an inductor.

* * * * *